(12) United States Patent
Bunch

(10) Patent No.: US 12,567,868 B2
(45) Date of Patent: Mar. 3, 2026

(54) ANALOG-TO-DIGITAL CONVERTER (ADC) WITH BACKGROUND CALIBRATION

(71) Applicant: Qorvo US, Inc., Greensboro, NC (US)

(72) Inventor: Ryan Lee Bunch, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 220 days.

(21) Appl. No.: 18/543,072

(22) Filed: Dec. 18, 2023

(65) Prior Publication Data

US 2024/0243750 A1 Jul. 18, 2024

Related U.S. Application Data

(60) Provisional application No. 63/479,786, filed on Jan. 13, 2023.

(51) Int. Cl.
*H03M 1/10* (2006.01)

(52) U.S. Cl.
CPC ................................. *H03M 1/1014* (2013.01)

(58) Field of Classification Search
CPC ....................................................... H03M 1/1014
USPC .......................................... 341/120, 118, 155
See application file for complete search history.

(56) References Cited

U.S. PATENT DOCUMENTS

| | | | | |
|---|---|---|---|---|
| 5,029,305 A | * | 7/1991 | Richardson | ......... H03M 1/0809 |
| | | | | 341/94 |
| 6,084,538 A | | 7/2000 | Kostelnik et al. | |

| | | | | |
|---|---|---|---|---|
| 9,503,116 B2 | | 11/2016 | Speir et al. | |
| 2008/0180289 A1 | | 7/2008 | Su et al. | |
| 2012/0206281 A1 | * | 8/2012 | Bashirullah | ......... H03M 1/1061 |
| | | | | 341/110 |

OTHER PUBLICATIONS

Paik, D. et al., "An 8-Bit 600-MSps Flash ADC Using Interpolating and Background Self-Calibrating Techniques," IEICE Transactions on Fundamentals of Electronics Communications and Computer Sciences, vol. E93-A, No. 2, Feb. 2010, pp. 402-414.

(Continued)

*Primary Examiner* — Peguy Jean Pierre
(74) *Attorney, Agent, or Firm* — Withrow & Terranova, P.L.L.C.

(57) ABSTRACT

Analog-to-digital converters (ADCs) with background calibration processes are disclosed. In one aspect, an ADC with a plurality of comparators that each compare an input voltage to voltages that are generated at taps across a plurality of references (e.g., a reference resistor ladder). The comparators are initially calibrated with foreground calibration routines and continuously recalibrated to compensate for aging, voltage, and temperature variations without interrupting operation of the ADC by randomly taking one comparator of the plurality of comparators off-line to run calibration processes without replacing that comparator. The value for the off-line comparator may be reliably inferred from values from neighboring comparators or, in some cases, guessed randomly. While possible errors may be introduced, such errors may be driven to a mean square quantization noise level through exemplary aspects of the present disclosure.

20 Claims, 8 Drawing Sheets

(56)     References Cited

OTHER PUBLICATIONS

Tsukamoto, S. et al., "A 7-bit 1-GS/s flash ADC with Background Calibration," IEICE Transactions on Fundamentals of Electronics Communications and Computer Sciences, vol. E97-C, No. 4, Apr. 2014, pp. 298-307.

Extended European Search Report for European Patent Application No. 24151261.5, mailed Jun. 12, 2024, 12 pages.

Kijima, M. et al., "A 6b 3GS/s flash ADC with background calibration," 2009 IEEE Custom Integrated Circuits Conference, Sep. 13-16, 2009, San Jose, CA, USA, IEEE, pp. 283-286.

Miyahara, M. et al., "A low-noise self-calibrating dynamic comparator for high-speed ADCs," 2008 IEEE Asian Solid-State Circuits Conference, Nov. 3-5, 2008, Fukuoka, Japan, IEEE, 4 pages.

* cited by examiner

ANALOG-TO-DIGITAL CONVERTER (ADC) WITH BACKGROUND CALIBRATION

PRIORITY APPLICATION

This application claims the benefit of U.S. Provisional Patent Application Ser. No. 63/479,786, filed Jan. 13, 2023, the disclosure of which is hereby incorporated herein by reference in its entirety.

BACKGROUND

I. Field of the Disclosure

The technology of the disclosure relates generally to analog-to-digital converters (ADCs) and, more particularly, to FLASH ADCs with background calibration capabilities.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased variety in the types of wireless communication. However, many forms of wireless communication rely on analog signals that are converted to digital signals in the receiver. This conversion is done by analog-to-digital converters (ADCs) which may be subject to size and power constraints that push designers to use small technologies (e.g., less than thirty nanometers (30 nm)). These small technologies create mismatches in the receive path. Correction of these mismatches provides room for innovation.

SUMMARY

Aspects disclosed in the detailed description include analog-to-digital converters (ADCs) with background calibration processes. In particular, exemplary aspects of the present disclosure contemplate an ADC with a plurality of comparators that each compare an input voltage to voltages that are generated at taps across a plurality of references (e.g., a reference resistor ladder). The comparators are initially calibrated with foreground calibration routines and continuously recalibrated to compensate for aging, voltage, and temperature variations without interrupting operation of the ADC by randomly taking one comparator of the plurality of comparators off-line to run calibration processes without replacing that comparator. The value for the off-line comparator may be reliably inferred from values from neighboring comparators or, in some cases, guessed randomly. While possible errors may be introduced, such errors may be driven to a mean square quantization noise level through exemplary aspects of the present disclosure. By avoiding use of a replacement comparator during calibration, large and power intensive switching networks are avoided resulting in an overall smaller circuit that consumes less power and has reliably calibrated comparators.

In this regard in one aspect, an ADC is disclosed. The ADC comprises a reference ladder configured to output a plurality of voltage reference levels at a corresponding number of reference outputs. The ADC also comprises an input voltage ladder configured to provide an input voltage value at a plurality of nodes equal to the corresponding number. The ADC also comprises a plurality of comparators, each coupled to the reference ladder and the input voltage ladder and configured to output a thermometer code value based on signals received from the reference ladder and the input voltage ladder. The ADC also comprises a thermometer decoder coupled to the plurality of comparators and configured to assemble the thermometer code values from the plurality of comparators and determine an output value based on how many comparators report a 1 or 0 as the respective thermometer code value. The ADC also comprises a calibration control circuit. The calibration control circuit is configured, while in normal operation, to take one of the plurality of comparators off-line without providing a substitute comparator. The calibration control circuit is also configured to assemble the thermometer code values from remaining ones of the plurality of comparators and provide the thermometer code value from the off-line comparator. When comparators above and below the off-line comparator are 1, the calibration control circuit is configured to assign the thermometer code value from the off-line comparator of 1. When the comparators above and below the off-line comparator are 0, the calibration control circuit is configured to assign the thermometer code value from the off-line comparator of 1. When the comparators above and below the off-line comparator are different, the calibration control circuit is configured to assign the thermometer code value from the off-line comparator randomly.

In another aspect, a mobile terminal is disclosed. The mobile terminal includes a transceiver circuit comprising an analog-to-digital converter (ADC). The ADC includes a reference ladder configured to output a plurality of voltage reference levels at a corresponding number of reference outputs. The ADC also comprises an input voltage ladder configured to provide an input voltage value at a plurality of nodes equal to the corresponding number. The ADC also comprises a plurality of comparators, each coupled to the reference ladder and the input voltage ladder and configured to output a thermometer code value based on signals received from the reference ladder and the input voltage ladder. The ADC also comprises a thermometer decoder coupled to the plurality of comparators and configured to assemble the thermometer code values from the plurality of comparators and determine an output value based on how many comparators report a 1 or 0 as the respective thermometer code value. The ADC also comprises a calibration control circuit. The calibration control circuit is configured, while in normal operation, to take one of the plurality of comparators off-line without providing a substitute comparator. The calibration control circuit is also configured to assemble the thermometer code values from remaining ones of the plurality of comparators and provide the thermometer code value from the off-line comparator. When comparators above and below the off-line comparator are 1, the calibration control circuit is configured to assign the thermometer code value from the off-line comparator of 1. When the comparators above and below the off-line comparator are 0, the calibration control circuit is configured to assign the thermometer code value from the off-line comparator of 1. When the comparators above and below the off-line comparator are different, the calibration control circuit is configured to assign the thermometer code value from the off-line comparator randomly.

In another aspect, a method of calibrating an ADC is disclosed. The method comprises taking one of a plurality of comparators off-line without providing a substitute comparator. The method also comprises assembling thermometer code values from remaining ones of the plurality of comparators. The method also comprises providing a value from the off-line comparator. When comparators above and below the off-line comparator are 1, the method comprises assigning the value from the off-line comparator of 1. When the comparators above and below the off-line comparator are 0, the method comprises assigning the value from the off-line comparator of 1. When the comparators above and below the off-line comparator are different, the method comprises assigning the value from the off-line comparator randomly.

DETAILED DESCRIPTION

Figure 1:
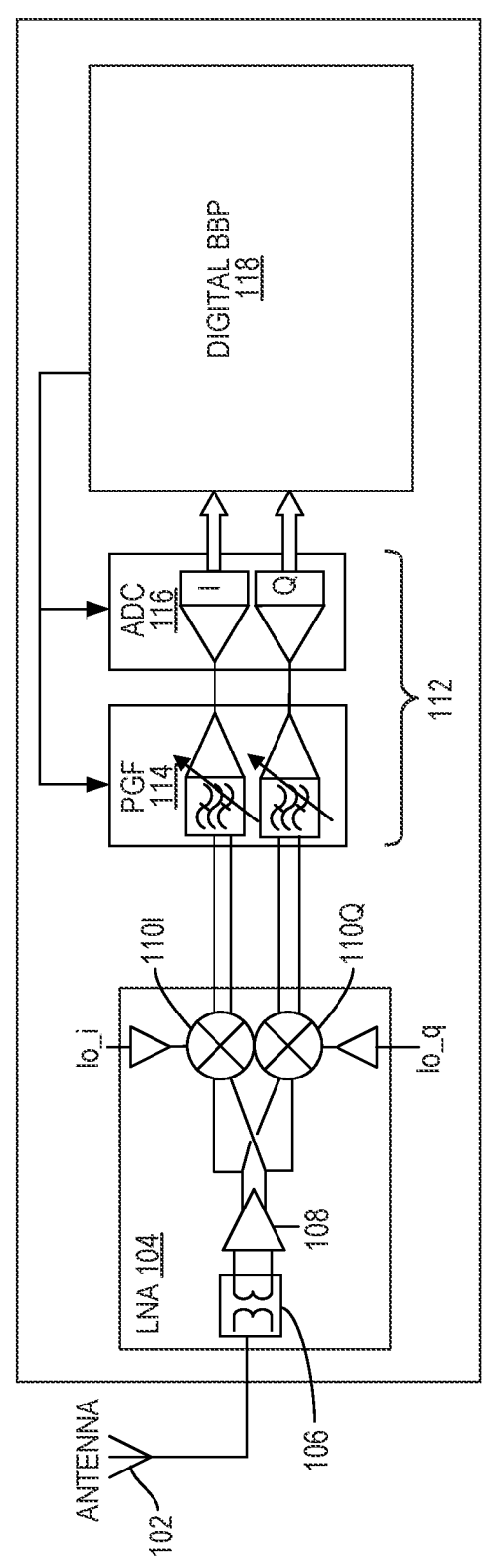
FIG. 1 is a block diagram of an exemplary receiver that may be present in a wireless communication device that includes one or more analog-to-digital converters (ADCs) that may benefit from aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include analog to digital converters (ADCs) with background calibration processes. In particular, exemplary aspects of the present disclosure contemplate an ADC with a plurality of comparators that each compare an input voltage to voltages that are generated at taps across a plurality of references (e.g., a reference resistor ladder). The comparators are initially calibrated with foreground calibration routines and continuously recalibrated to compensate for aging, voltage, and temperature variations without interrupting operation of the ADC by randomly taking one comparator of the plurality of comparators off-line to run calibration processes without replacing that comparator. The value for the off-line comparator may be reliably inferred from values from neighboring comparators or, in some cases, guessed randomly. While possible errors may be introduced, such errors may be driven to a mean square quantization noise level through exemplary aspects of the present disclosure. By avoiding use of a replacement comparator during calibration, large and power intensive switching networks are avoided resulting in an overall smaller circuit that consumes less power and has reliably calibrated comparators.

Before explaining specific exemplary aspects of the present disclosure, an overview of the context of the present disclosure and some of the shortcomings of conventional approaches are explored in FIGS. 1-4B. A discussion of exemplary aspects of the present disclosure begins below with reference to FIG. 5.

In this regard, FIG. 1 is a block diagram of a receiver chain 100 that may be present in a mobile terminal such as cellular phones, smart watches, tablets, computers, navigation devices, access points, and like wireless communication devices that support wireless communications, such as cellular, wireless local area network (WLAN), Bluetooth, and near field communications. For the purposes of illustration, the receiver chain 100 is for an ultrawideband (UWB) receiver for which emitted signal bandwidth exceeds the lesser of 500 Megahertz (MHz) or twenty percent (20%) of the arithmetic center frequency. It should be appreciated that other technologies may benefit from aspects of the present disclosure.

The receiver chain 100 may include an antenna 102 upon which incoming signals impinge, exciting a current that flows to a low noise amplifier (LNA) stage 104. The LNA stage 104 may include a transformer 106 and an LNA 108 that may convert a single-ended signal to a differential signal or quadrature signal. The differential or quadrature signal may be downconverted in mixers 110I, 110Q by mixing with signals lo_i and lo_q from a local oscillator(s). The downconverted signal(s) may be passed to an intermediate frequency (IF) stage 112 that may include a programmable gain filter(s) 114 and an ADC 116. The ADC 116 may convert the quadrature signals into digital quadrature signals which are passed to a digital baseband processor (BBP) 118 for further processing. In exemplary aspects of the present disclosure, the ADC 116 may be a four-bit FLASH ADC, although lower or higher resolution ADCs may also benefit from the present disclosure.

Figure 2:
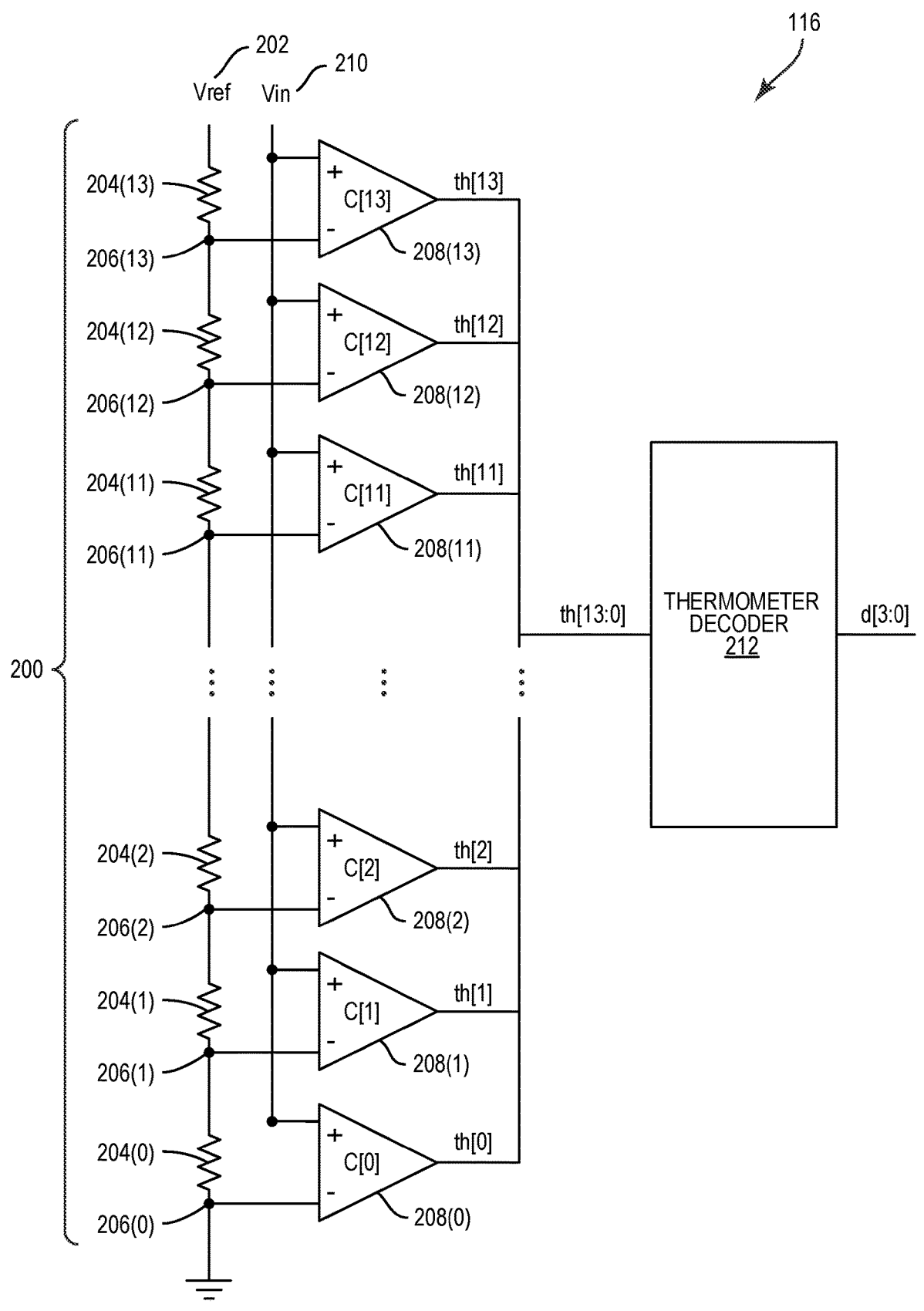
FIG. 2 is a block diagram of a portion of a given ADC such as one of the ADCs of FIG. 1.

A FLASH ADC 116 is shown in greater detail in FIG. 2. Specifically, a reference ladder 200 may be formed when a reference voltage (Vref) 202 is supplied to a plurality of serially-linked resistors 204(0)-204(13). While a reference resistor ladder is contemplated and discussed, other formats of an ADC could also use the present disclosure where there is a plurality of references. Respective taps 206(0)-206(13) couple from the reference ladder 200 to negative inputs of comparators 208(0)-208(13). Positive inputs of the comparators 208(0)-208(13) are coupled to an input voltage signal (Vin) 210. Thus, the comparators 208(0)-208(13) compare the input voltage signal 210 to voltages that are generated at the taps 206(0)-206(13). The comparators 208 (0)-208(13) divide the input into fifteen distinct quantization levels and provide thermometer code output signals th[0]-th[13] to a thermometer decoder 212 which recodes the thermometer code output signals into a binary format. In this example, the thermometer decoder 212 produces a balanced output that spans the range of −7 to 7. The input/output relationship of the thermometer decoder 212 is shown in Table 1.

TABLE 1

| Thermometer code | Data |
| --- | --- |
| 00000000000000 | −7 |
| 10000000000000 | −6 |
| 11000000000000 | −5 |
| 11100000000000 | −4 |
| 11110000000000 | −3 |

TABLE 1-continued

| Thermometer code | Data |
| --- | --- |
| 11111000000000 | −2 |
| 11111100000000 | −1 |
| 11111110000000 | 0 |
| 11111111000000 | 1 |
| 11111111100000 | 2 |
| 11111111110000 | 3 |
| 11111111111000 | 4 |
| 11111111111100 | 5 |
| 11111111111110 | 6 |
| 11111111111111 | 7 |

The data value can be determined by adding the number of 1s and subtracting 7 from the result. This method of generating the output is also robust against bubble errors in the output code. It should be appreciated that a given column within the thermometer code corresponds to an output from a comparator (i.e., the third column is th[2]).

Figure 3:
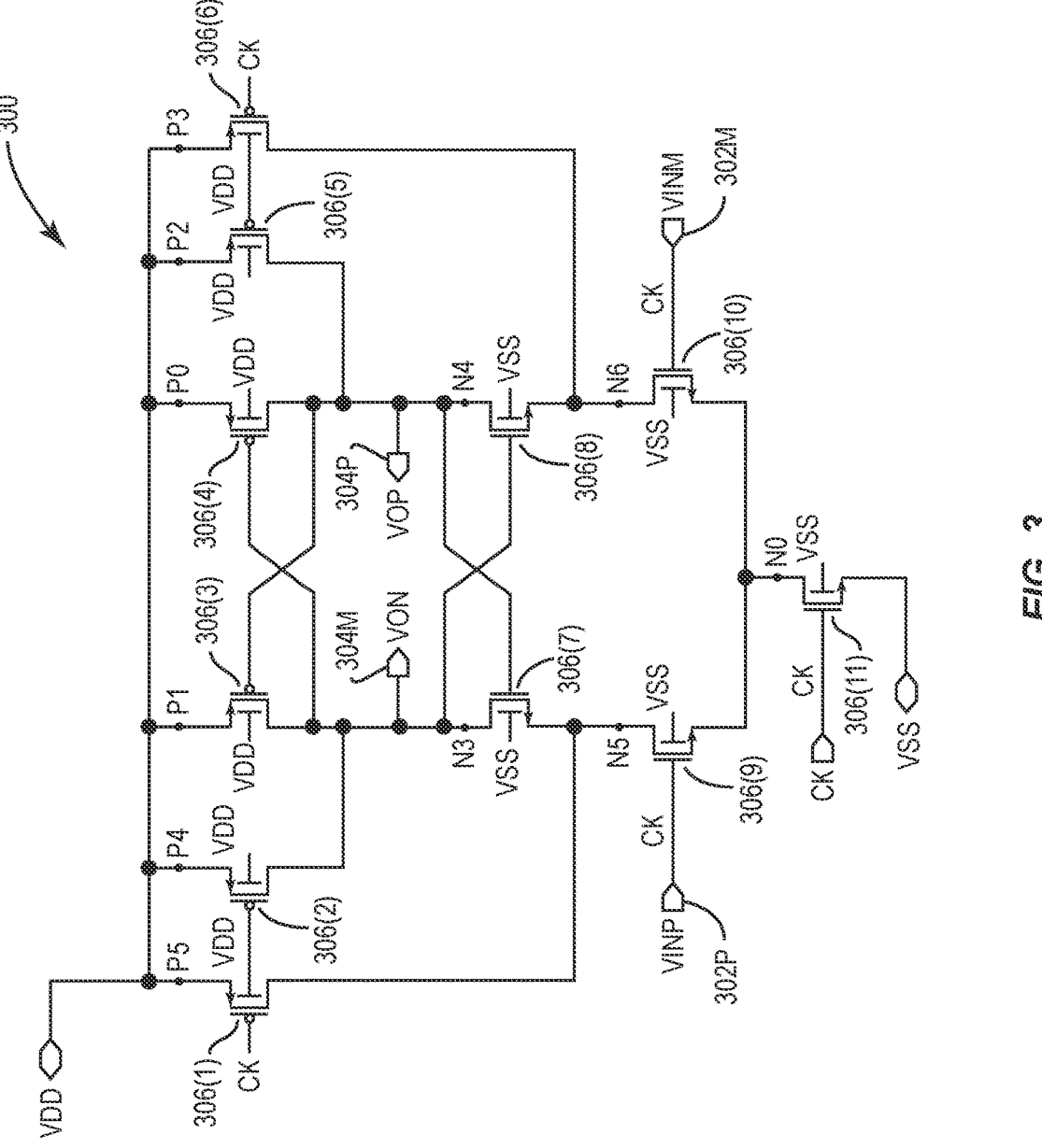
FIG. 3 is a circuit diagram of a conventional comparator that may suffer from mismatch in an input differential pair.

FIG. 3 is a circuit diagram of a conventional comparator 300 that can be used for any of the comparators 208(0)-208 (13). The comparator 300 includes differential inputs 302P and 302M and outputs 304P and 304M. Commercial pressures to minimize size and power consumption have caused the field effect transistors (FETs) 306(1)-306(11) to be implemented in increasingly small technologies. For example, it is now not uncommon for the FETs 306(1)-306 (11) to be implemented in sub-thirty nanometer (<30 nm) technologies using at or near minimum allowable gate width and length allowed by the technology design rules. When the sizes get this small, there is threshold mismatch of the transistors 306(9)-306(10) forming the input differential pair. That is, instead of Vin=VINP−VINM triggering the comparator 300 when equal to 0, Vin must be some value greater than 0 to trigger the comparator 300.

This input mismatch means that Vin is not being compared precisely to the desired Vref and may result in erroneous outputs. However, because this problem is known, there have been a number of solutions validated to remedy this problem.

Figure 4A:
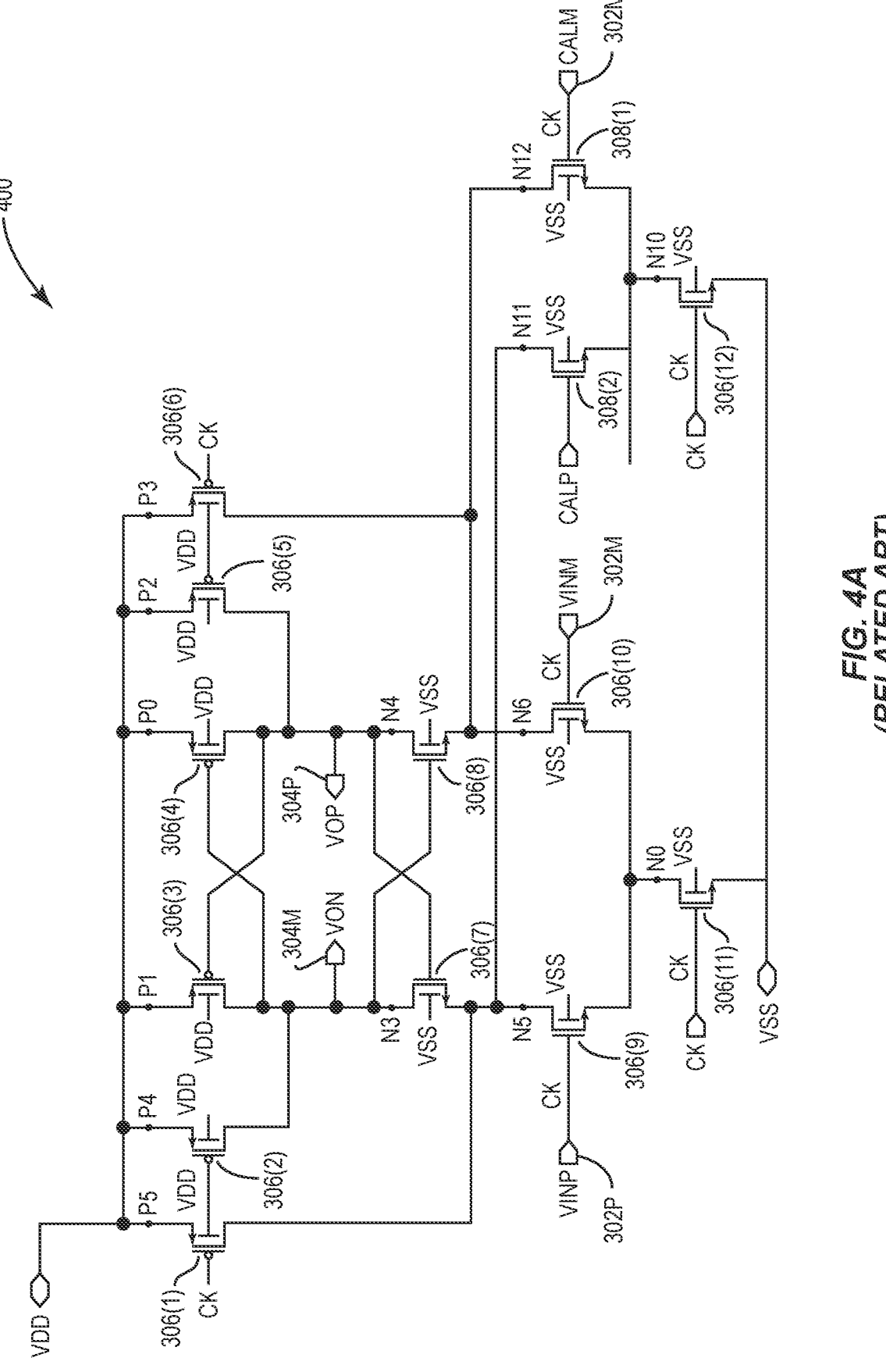
FIG. 4A is a circuit diagram of a comparator with a first calibration circuit calibrated according to an exemplary aspect of the present disclosure.

If the comparator 208(0)-208(13) is implemented on bulk complementary metal oxide semiconductor (CMOS) technology, the traditional approach is to add a secondary differential pair 308(1)-308(2) and FET 306(12) to a comparator 400 as shown in FIG. 4A.

Figure 4B:
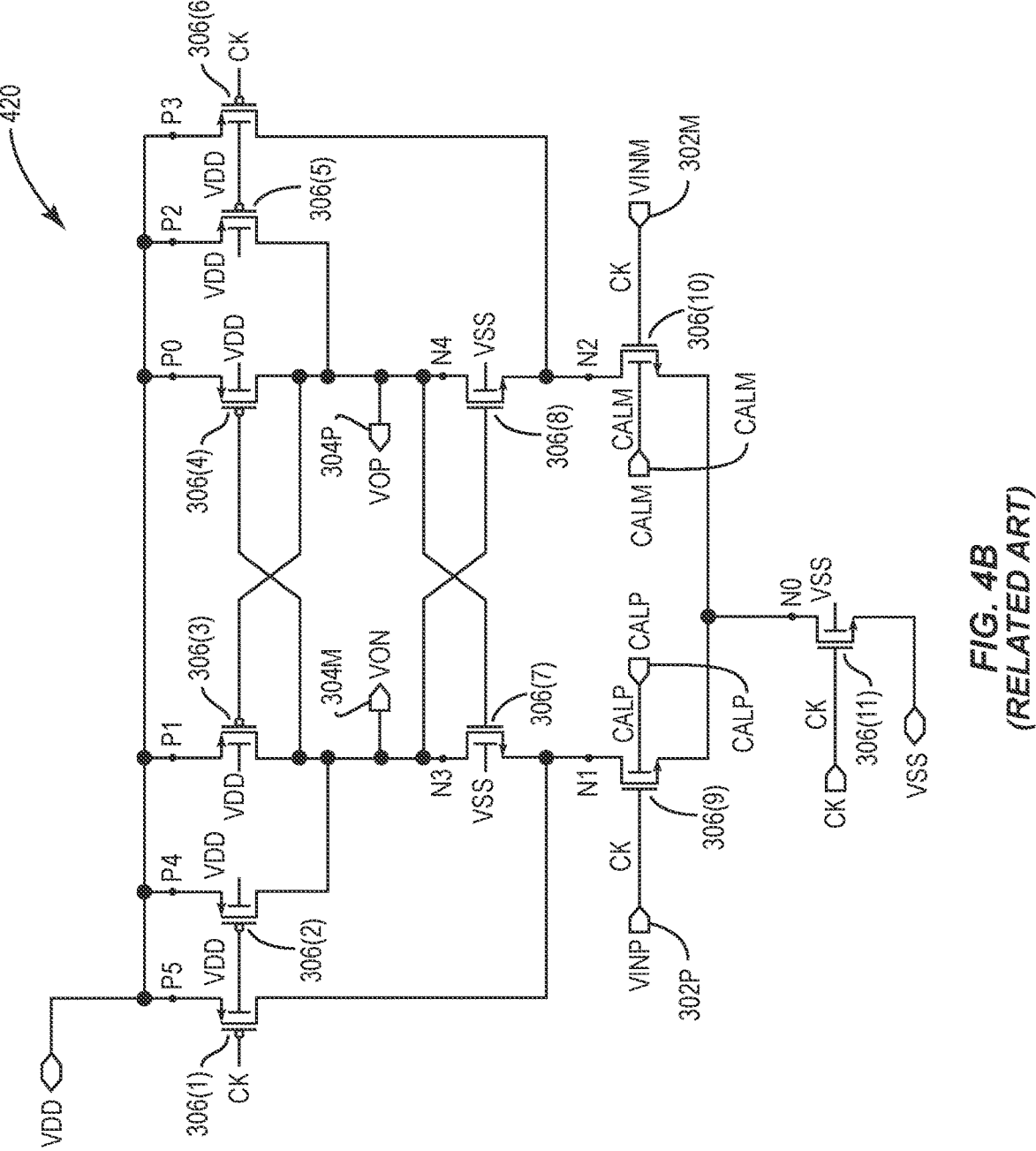
FIG. 4B is a circuit diagram of a comparator with a second calibration circuit calibrated according to an exemplary aspect of the present disclosure.

If a comparator 208(0)-208(13) is implemented in silicon on insulator (SOI) technology, the correction may be applied through a back bias as better illustrated by comparator 420 in FIG. 4B. Specifically, calibration signals CALM and CALP are applied to FETs 306(10) and 306(9), respectively.

The quandary becomes how to find the desired calibration signals to cancel the mismatch of the comparators. Traditionally, a comparator is taken off-line and inputs 302P and 302M are shorted. A compensating voltage (derived by a calibration circuit) is then provided to the back bias of the FETs 306(10) and 306(9) or to set the secondary differential pair 308(1)-308(2). If a background calibration operation is being done (as may be the case when trying to correct for changing temperature, aging, or other environment change), while the comparator is taken off-line for calibration, traditional techniques use a spare comparator to "fill in" or act as a substitute for the off-line comparator. In this fashion, the spare comparator may be used as each comparator 208(0)-208(13) is tested. However, such substitution requires a relatively large and complex switching network that imposes a size and power consumption penalty on the ADC that contains such built-in testing system.

Exemplary aspects of the present disclosure provide for in situ, in use calibration measurements without having to provide a spare comparator that acts as a substitute for the comparator being tested. In particular, exemplary aspects of the present disclosure take advantage of redundant information in the thermometer code. Specifically, having a comparator off-line only matters if that specific comparator is the one that is at the threshold where the 0 changes to a 1 in the thermometer code. Otherwise, the information provided by the adjacent comparators may be used to "know" what value the off-line comparator should have reported. For those times when the off-line comparator is actually at the threshold, a control circuit may randomly "guess" the value. If, instead, a 0 or 1 was always chosen in instances of uncertainty, such consistent selection would create a direct current offset error. While in some instances this will introduce an error, aspects of the present disclosure provide options to reduce this error to something approaching a root mean square quantization noise level or error.

Figure 5:
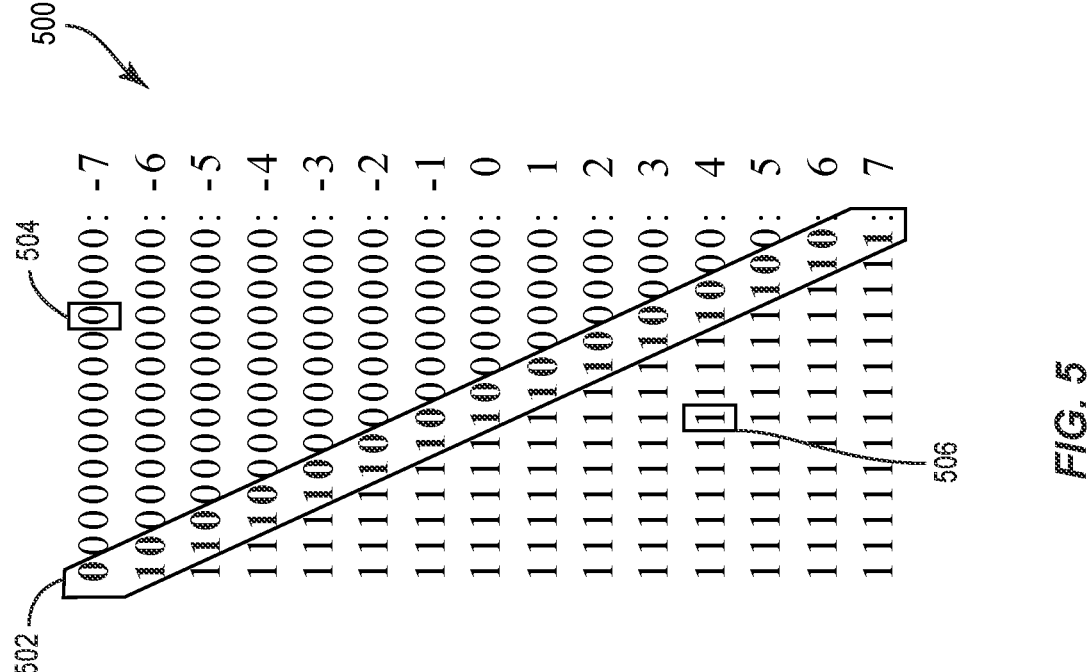
FIG. 5 is a table that shows where the critical data from Table 1 may be found in the output of the comparators.

The redundancy of the thermometer code is provided by chart 500 in FIG. 5 that duplicates Table 1 from above but highlights within block 502 the transition bits within the thermometer code. Outside block 502, any given bit may be known by knowing the adjacent bit(s). For example, at block 504, the value may be determined by the value of bits to either side. Since both those bits are 0, then the value of block 504 necessarily must be zero. Likewise, for block 506, the value may be determined by the value of bits to either side. Since both those bits are 1, then the value of block 506 necessarily must be 1.

Figure 6:
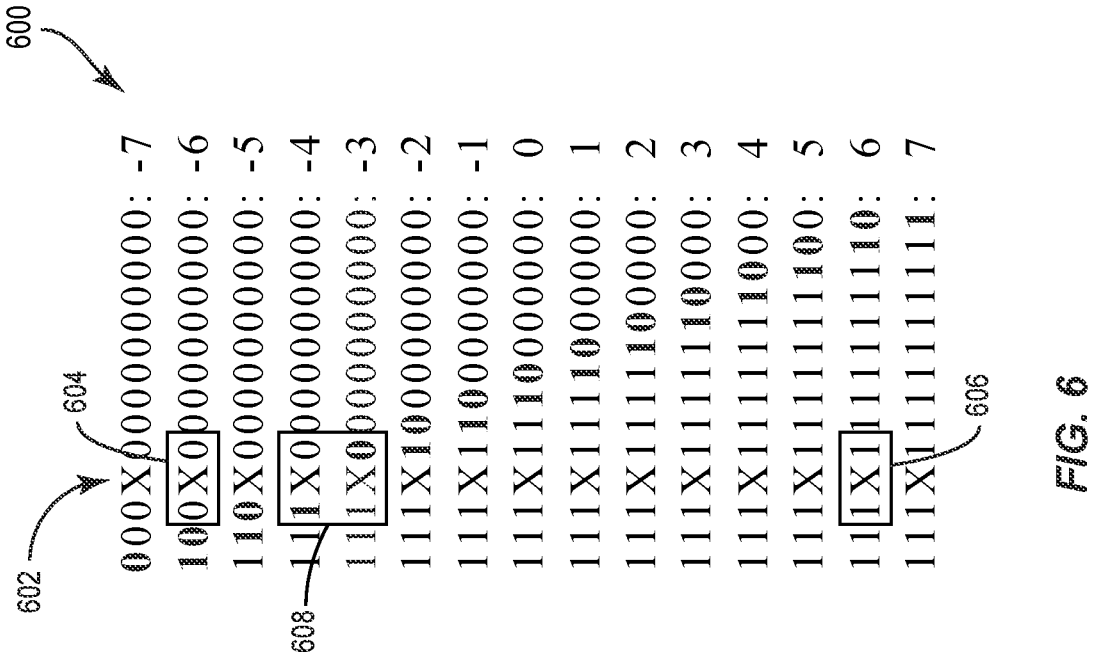
FIG. 6 is a table that highlights how redundant the information in FIG. 5 is and where an error may arise when a comparator is taken off-line without a replacement or substitute.

Only when the comparator corresponding to the transition bit (where 1 becomes 0) is off-line will it create an ambiguity as seen in graph 600 of FIG. 6 when comparator 208(3) is taken offline (shown by the X in the column 602 corresponding to the fourth comparator (i.e., comparator 208(3)). For example, at block 604, both bits are 0, therefore comparator 208(3) would have reported a 0. Likewise, at block 606, both bits are 1, therefore comparator 208(3) would have reported a 1. Within block 608, examination of the bits to either side of the off-line comparator 208(3) shows a 1 and a 0 and the control circuit may not know whether the transition is at −4 or −3. In such a case, the control circuit may randomly determine whether the proper transition is at the −4 or the −3. If the random determination is correct, there is no error. If, however, the random determination is incorrect, aspects of the present disclosure allow for minimization of the impact of this error.

Figure 7:
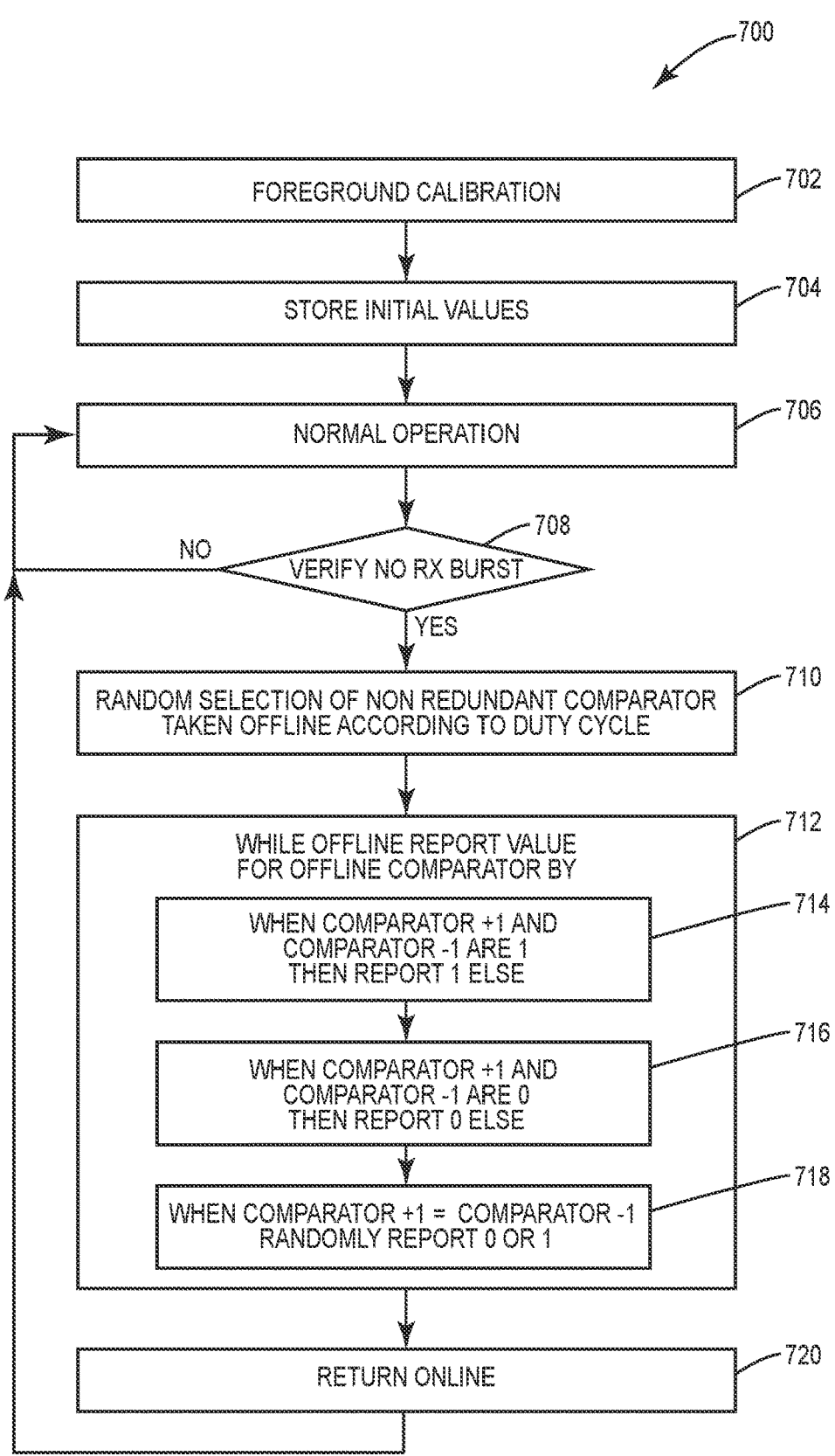
FIG. 7 is a flowchart outlining an exemplary process for performing background calibration of an ADC according to aspects of the present disclosure.

The process of the present disclosure is provided with reference to FIG. 7 which shows process 700 as a flowchart. Specifically, the process 700 starts with foreground calibration (block 702) such as at manufacturing, installation, or on a cold power up. All comparators may be calibrated concurrently. Foreground calibration involves no active signals being sent and allows a full systemic calibration of each comparator 208 without concern for impact on the comparators 208 being off-line. Whatever initial values are determined may be stored (block 704) in memory associated with the ADC. Normal operation of the ADC begins (block 706).

A control circuit associated with the ADC may determine that no receive (RX) burst is occurring (block 708). This determination may be based on information provided by the BBP or other detection of a preamble. If there is an RX burst occurring, the process 700 may return to normal operation (block 706) without performing a calibration step. Avoiding calibration during an RX burst eliminates any signal-to-noise ratio (SNR) penalty that the calibration might incur because the preamble detection window does not limit receive sensitivity and any errors in the preamble detection window do not penalize operation. Note that this step is optional but helps lower the calibration-induced error. If there is no RX burst, the control circuit may randomly select a non-redundant comparator to be taken off-line based on a duty cycle (block 710). That is, to spread the impact of possible error, not every clock cycle requires a calibration step. Rather, a calibration step may be done every ten clock cycles, twenty clock cycles, or some other value. Again, this has the impact of minimizing the impact on the SNR. Likewise, by randomly selecting the comparator to be taken off-line, any errors are introduced randomly, which begins to approximate white noise. While the comparator is off-line, a reported value for the off-line comparator is created (block 712) to repair damaged thermometer code by the following decision logic. When the comparator +1 (above) and the comparator −1 (below) are both 1, then report a 1 (block 714), else when the comparator +1 and the comparator −1 are both 0, then report a 0 (block 716), else when the comparator +1 is not equal to the comparator −1, then randomly report a 0 or 1 (block 718). Note that the corner cases that may occur when comparator 208(0) or comparator 208(13) are taken off-line may simplify the decision by creating a "phantom" 0 or 1 to the left or right, respectively, for the value of missing comparator −1 or comparator +1, respectively. Alternatively, if comparator 208(0) is off-line, then always randomly assign for comparator 208(0) if comparator 208(1) is 0. Likewise, if comparator 208(13) is off-line, always randomly assign for comparator 208(13) if comparator 208(12) is 1. The process 700 then returns the comparator to an online state (block 720) and normal operation continues (block 706). Note that the root mean square of the error is (without block 708 and without adjusting a duty cycle) $\sqrt{14}$ or about 0.267 codes (for 14 comparators). In contrast, the mean square quantization noise level is $\sqrt{12}$.

The actual comparator calibration loop is not central to the present disclosure. One such calibration loop is shown in *A low-noise self-calibrating dynamic comparator for high-speed ADCs* by Miyahara et al. published at 2008 IEEE Asian Solid-State Circuits Conference and available at the IEEE website (https://ieeexplore.ieee.org/abstract/document/4708780).

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An analog-to-digital converter (ADC) comprising:
a reference ladder configured to output a plurality of voltage reference levels at a corresponding number of reference outputs;
an input voltage ladder configured to provide an input voltage value at a plurality of nodes equal to the corresponding number of reference outputs;
a plurality of comparators, each coupled to the reference ladder and the input voltage ladder and configured to output a thermometer code value based on signals received from the reference ladder and the input voltage ladder;
a thermometer decoder coupled to the plurality of comparators and configured to assemble the thermometer code values from the plurality of comparators and determine an output value based on how many comparators report a 1 or 0 as the respective thermometer code value; and
a calibration control circuit configured to:
while in normal operation, randomly take one of the plurality of comparators off-line without providing a substitute comparator; and
assemble the thermometer code values from remaining ones of the plurality of comparators and provide the thermometer code value from the off-line comparator by:
when comparators above and below the off-line comparator are 1, assign the thermometer code value from the off-line comparator to 1;
when the comparators above and below the off-line comparator are 0, assign the thermometer code value from the off-line comparator to 0; and
when the comparators above and below the off-line comparator are different, assign the thermometer code value from the off-line comparator randomly to 1 or 0.

2. The ADC of claim 1, wherein the calibration control circuit is further configured to, when there is no comparator below the off-line comparator and when the comparator above the off-line comparator is 1, assign the thermometer code value from the off-line comparator to 1.

3. The ADC of claim 2, wherein the calibration control circuit is further configured to, when there is no comparator below the off-line comparator and when the comparator above the off-line comparator is 0, randomly assign the thermometer code value from the off-line comparator.

4. The ADC of claim 1, wherein the calibration control circuit is further configured to, when there is no comparator above the off-line comparator and when the comparator below the off-line comparator is 0, assign the thermometer code value from the off-line comparator to 0.

5. The ADC of claim 4, wherein the calibration control circuit is further configured to, when there is no comparator above the off-line comparator and when the comparator below the off-line comparator is 1, randomly assign the thermometer code value from the off-line comparator.

6. The ADC of claim 1, wherein the reference ladder comprises a plurality of serially-positioned resistors.

7. The ADC of claim 1, wherein the calibration control circuit is further configured to set a duty cycle that controls how often a comparator is taken off-line.

8. The ADC of claim 1, wherein the calibration control circuit is further configured to receive an indication of a receive preamble and take the one of the plurality of comparators off-line during the receive preamble.

9. The ADC of claim 8, wherein the calibration control circuit is further configured to not take a comparator off-line when a receive burst occurs.

10. The ADC of claim 1, wherein the calibration control circuit is further configured to lower a duty cycle of taking one of the plurality of comparators off-line without providing a substitute comparator.

11. The ADC of claim 1, wherein the reference ladder comprises a plurality of references.

12. A mobile terminal comprising:
a transceiver circuit comprising an analog-to-digital converter (ADC), comprising:
a reference ladder configured to output a plurality of voltage reference levels at a corresponding number of reference outputs;
an input voltage ladder configured to provide an input voltage value at a plurality of nodes equal to the corresponding number of reference outputs;
a plurality of comparators, each coupled to the reference ladder and the input voltage ladder and configured to output a thermometer code value based on signals received from the reference ladder and the input voltage ladder;
a thermometer decoder coupled to the plurality of comparators and configured to assemble the thermometer code values from the plurality of comparators and determine an output value based on how many comparators report a 1 or 0 as the respective thermometer code value; and
a calibration control circuit configured to:
while in normal operation, randomly take one of the plurality of comparators off-line without providing a substitute comparator; and
assemble the thermometer code values from remaining ones of the plurality of comparators and provide the thermometer code value from the off-line comparator by:
when comparators above and below the off-line comparator are 1, assign the thermometer code value from the off-line comparator to 1;
when the comparators above and below the off-line comparator are 0, assign the thermometer code value from the off-line comparator to 0; and
when the comparators above and below the off-line comparator are different, assign the thermometer code value from the off-line comparator randomly to 1 or 0.

13. A method of calibrating an analog-to-digital converter (ADC), comprising:
taking one of a plurality of comparators off-line without providing a substitute comparator;
assembling thermometer code values from remaining ones of the plurality of comparators; and
providing a value from the off-line comparator by:
when comparators above and below the off-line comparator are 1, assigning the value from the off-line comparator to 1;
when the comparators above and below the off-line comparator are 0, assigning the value from the off-line comparator to 0; and when the comparators above and below the off-line comparator are different, assigning the value from the off-line comparator randomly.

14. The method of claim 13, further comprising taking the one of the plurality of comparators off-line after receipt of a receive preamble indication.

15. The method of claim 14, further comprising not taking the one of the plurality of comparators off-line during a receive burst.

16. The method of claim 13, further comprising imposing a duty cycle on how frequently a comparator of the plurality of comparators is taken off-line.

17. The method of claim 13, further comprising providing the value by, when there is no comparator below the off-line comparator and when the comparator above the off-line comparator is 1, assigning the value from the off-line comparator to 1.

18. The method of claim 17, further comprising providing the value by, when there is no comparator below the off-line comparator and when the comparator above the off-line comparator is 0, randomly assigning the value from the off-line comparator.

19. The method of claim 13, further comprising providing the value by, when there is no comparator above the off-line comparator and when the comparator below the off-line comparator is 0, assigning the value from the off-line comparator to 0.

20. The method of claim 19, further comprising providing the value by, when there is no comparator above the off-line comparator and when the comparator below the off-line comparator is 1, randomly assigning the value from the off-line comparator.

\* \* \* \* \*